(12) United States Patent
Kang et al.

(10) Patent No.: US 7,659,617 B2
(45) Date of Patent: Feb. 9, 2010

(54) SUBSTRATE FOR A FLEXIBLE MICROELECTRONIC ASSEMBLY AND A METHOD OF FABRICATING THEREOF

(75) Inventors: Teck-Gyu Kang, San Jose, CA (US); Jae M. Park, San Jose, CA (US); Yoichi Kubota, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 358 days.

(21) Appl. No.: 11/606,771

(22) Filed: Nov. 30, 2006

(65) Prior Publication Data

US 2008/0128886 A1    Jun. 5, 2008

(51) Int. Cl.
*H01L 23/34* (2006.01)

(52) U.S. Cl. .................. 257/723; 257/668; 257/690; 257/737; 257/738; 257/773; 257/E21.705

(58) Field of Classification Search .................. None
See application file for complete search history.

(56) References Cited

U.S. PATENT DOCUMENTS

| | | | |
|---|---|---|---|
| 6,268,231 B1 | 7/2001 | Wetzel | |
| 6,320,128 B1 | 11/2001 | Glovatsky et al. | |
| 2002/0006696 A1* | 1/2002 | Akram | 438/200 |
| 2003/0233134 A1 | 12/2003 | Greenberg et al. | |
| 2004/0042183 A1 | 3/2004 | Alcaria et al. | |
| 2005/0174469 A1 | 8/2005 | Cho et al. | |

FOREIGN PATENT DOCUMENTS

| | | |
|---|---|---|
| DE | 4428158 | 2/1995 |
| GB | 2236062 | 3/1991 |

OTHER PUBLICATIONS

International Search Report, PCT/US2007/24589, Written opinion dated May 14, 2008.

* cited by examiner

*Primary Examiner*—N Drew Richards
*Assistant Examiner*—Kyoung Lee
(74) *Attorney, Agent, or Firm*—Lerner, David, Littenberg, Krumholz & Mentlik, LLP

(57) ABSTRACT

Substrates having integrated rigid and flexible regions and methods of fabricating such substrates are disclosed. The substrates may advantageously be used for mounting semiconductor chips used in flexible microelectronic assemblies.

23 Claims, 24 Drawing Sheets

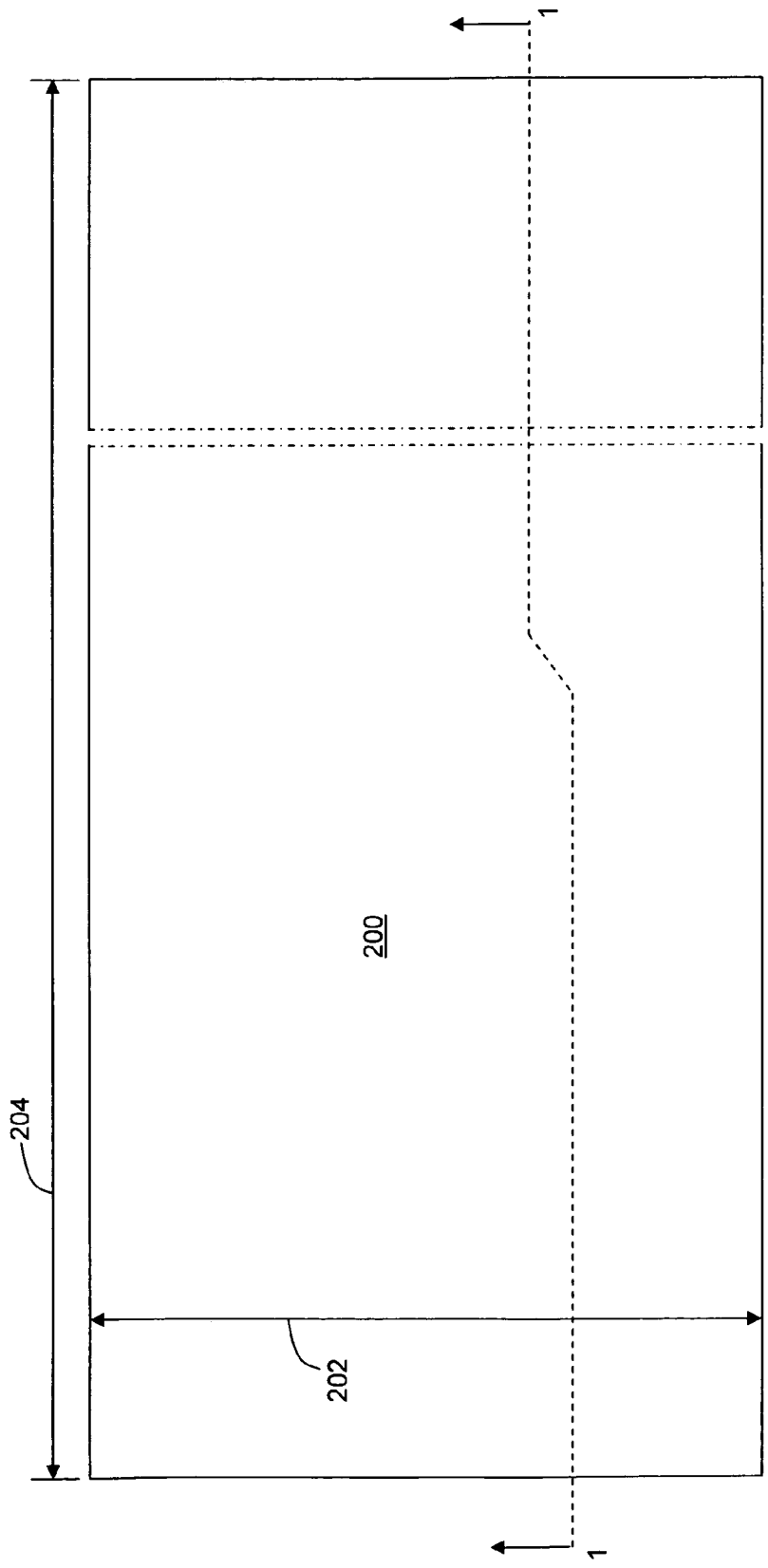
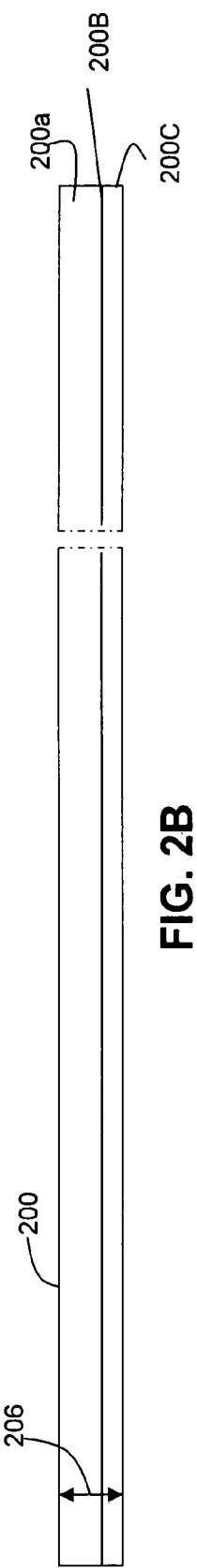
FIG. 2A
FIG. 2B

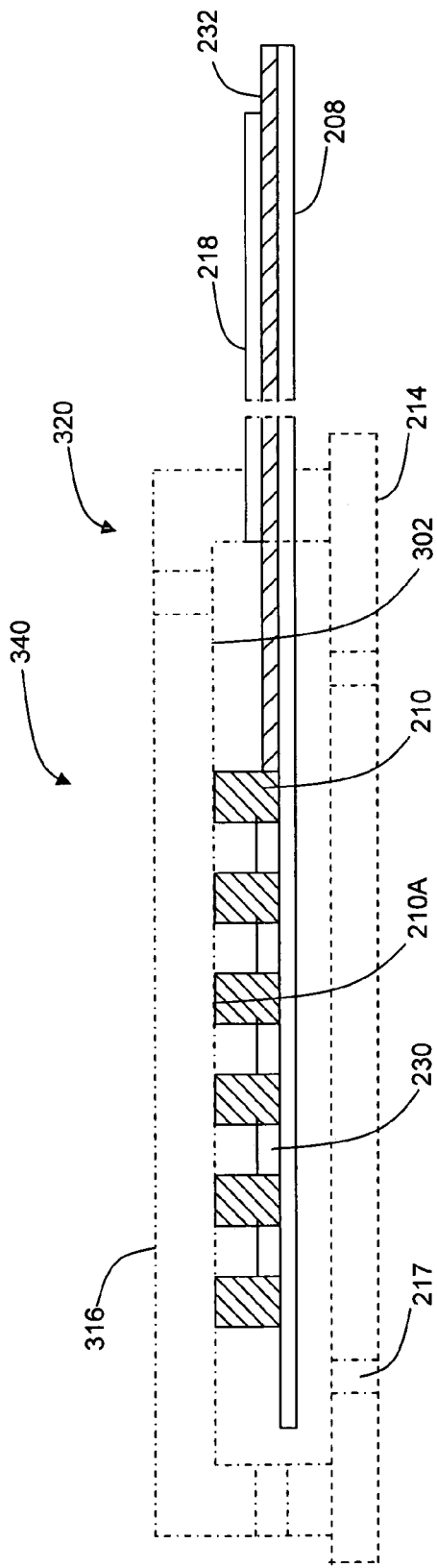
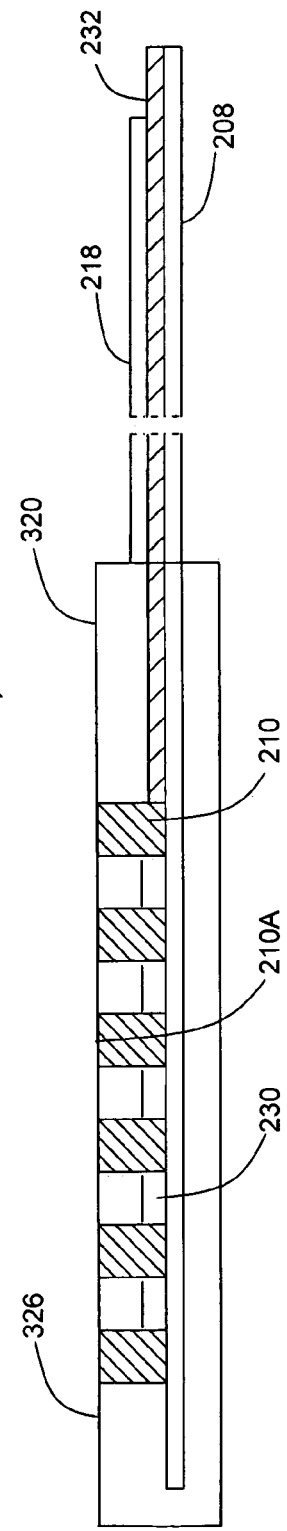
FIG. 3A
FIG. 3B

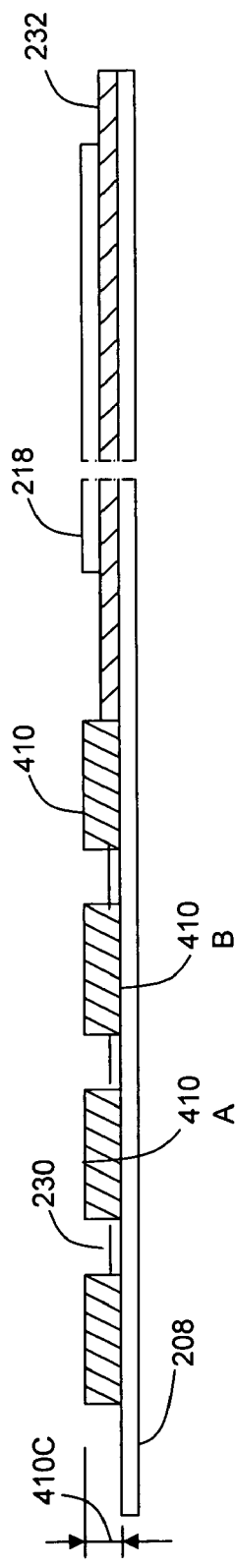
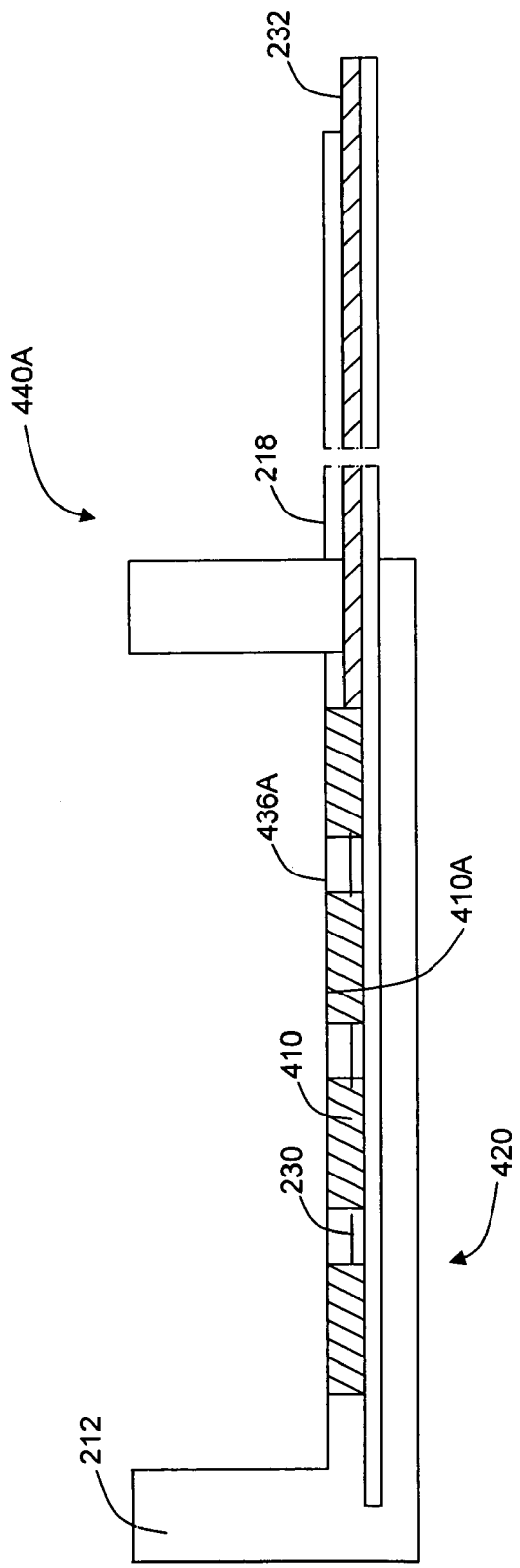

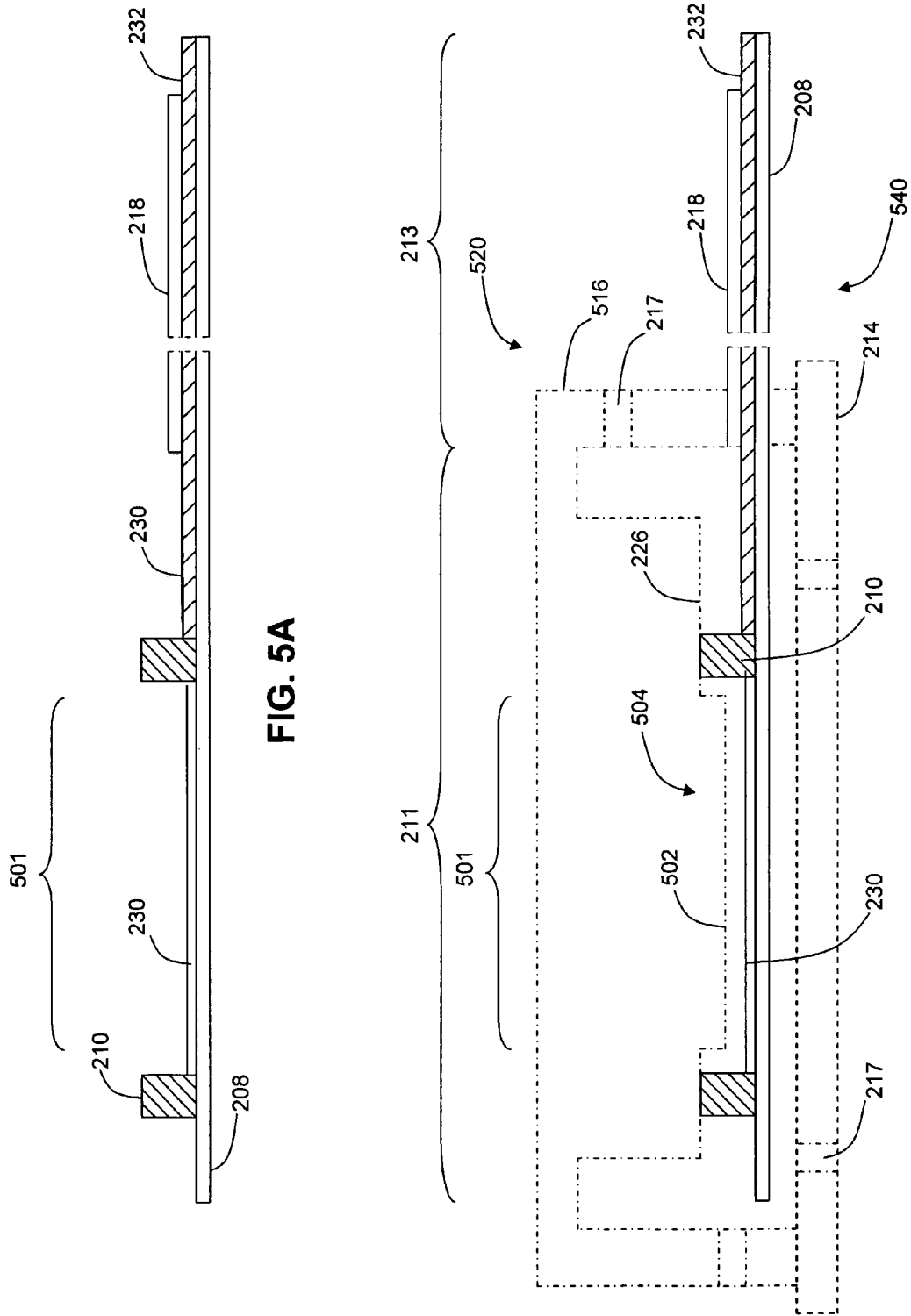

SUBSTRATE FOR A FLEXIBLE MICROELECTRONIC ASSEMBLY AND A METHOD OF FABRICATING THEREOF

FIELD OF THE INVENTION

The present invention generally relates to microelectronic assemblies and, in particular, to substrates used in flexible microelectronic assemblies and methods of fabricating such substrates.

BACKGROUND OF THE INVENTION

Integrated circuits are usually manufactured on semiconductor wafers which are subsequently cut into individual dies. Each die is a microelectronic device, such as a memory cell array, a processor, an electronic or opto-electronic sensor array, a micro-electromechanical system (MEMS), and the like. Such a device, which may be extremely thin, is mounted on a substrate which protects the mechanical integrity of the device and provides connectivity to other circuits of a microelectronic assembly. Complex devices may require many tens, even hundreds of input and output connections to the substrate.

In many applications (for example, digital cameras, cellular phones, laptop computers, or biometric devices such as finger print readers, among other applications), substrates carrying microelectronic devices are interconnected with other circuits using flexible cables. Conventionally, a flexible cable (e.g., tape cable) is connected to terminals of the substrate using a wire bonding or ball bonding technique. Together with the flexible cable, the substrate forms a two-component packaging platform for the device of the respective microelectronic assembly.

Despite considerable efforts devoted in the art heretofore to development of substrates for microelectronic assemblies and methods for fabricating such substrates, further improvement would be desirable.

SUMMARY OF THE INVENTION

One aspect of the present invention provides a substrate comprising a dielectric structure bearing contact elements in a first region and bearing unitary traces extending between the first region and a second region, at least some of the traces being connected to at least some of the contact elements. A first dielectric encapsulant is disposed on the dielectric structure in the first region so the contact elements are exposed in the first region. The substrate is preferably used in a microelectronic assembly.

Other aspects of the present invention provide methods for fabricating substrates for microelectronic assemblies. In one embodiment, a method comprises the step of applying a first dielectric encapsulant in a first region of a dielectric structure bearing contact elements in the first region and unitary traces connected to at least some of the contact elements, at least some of the traces extending between the first region and a second region of the dielectric structure remote from the first region. The applying step is performed so as to leave the contact elements at least partially exposed in the first region.

Still further aspects of the invention provide microelectronic assemblies in which microelectronic devices are mounted on the substrates.

The summary is neither intended nor should it be construed as being representative of the full extent and scope of the present invention, which additional aspects will become more readily apparent from the detailed description, particularly when taken together with the appended drawings.

BRIEF DESCRIPTION OF THE DRAWINGS

FIGS. 2A-2J are schematic, top (FIGS. 2A, 2I-2J) and cross-sectional (FIGS. 2B-2H) views of portions of a substrate during successive stages of the method of FIG. 1;

FIGS. 3A-3C are schematic, cross-sectional (FIGS. 3A-3B) and top (FIG. 3C) views of portions of a substrate during successive stages of a method according to another embodiment of the invention;

FIGS. 4A-4D are schematic, cross-sectional (FIGS. 4A-4C) and top (FIG. 4D) views of portions of a substrate during successive stages of a method according to yet another embodiment of the invention;

FIGS. 5A-5C are schematic, cross-sectional views of portions of a substrate during successive stages of a method according to still another embodiment of the invention;

DETAILED DESCRIPTION

Figure 1:
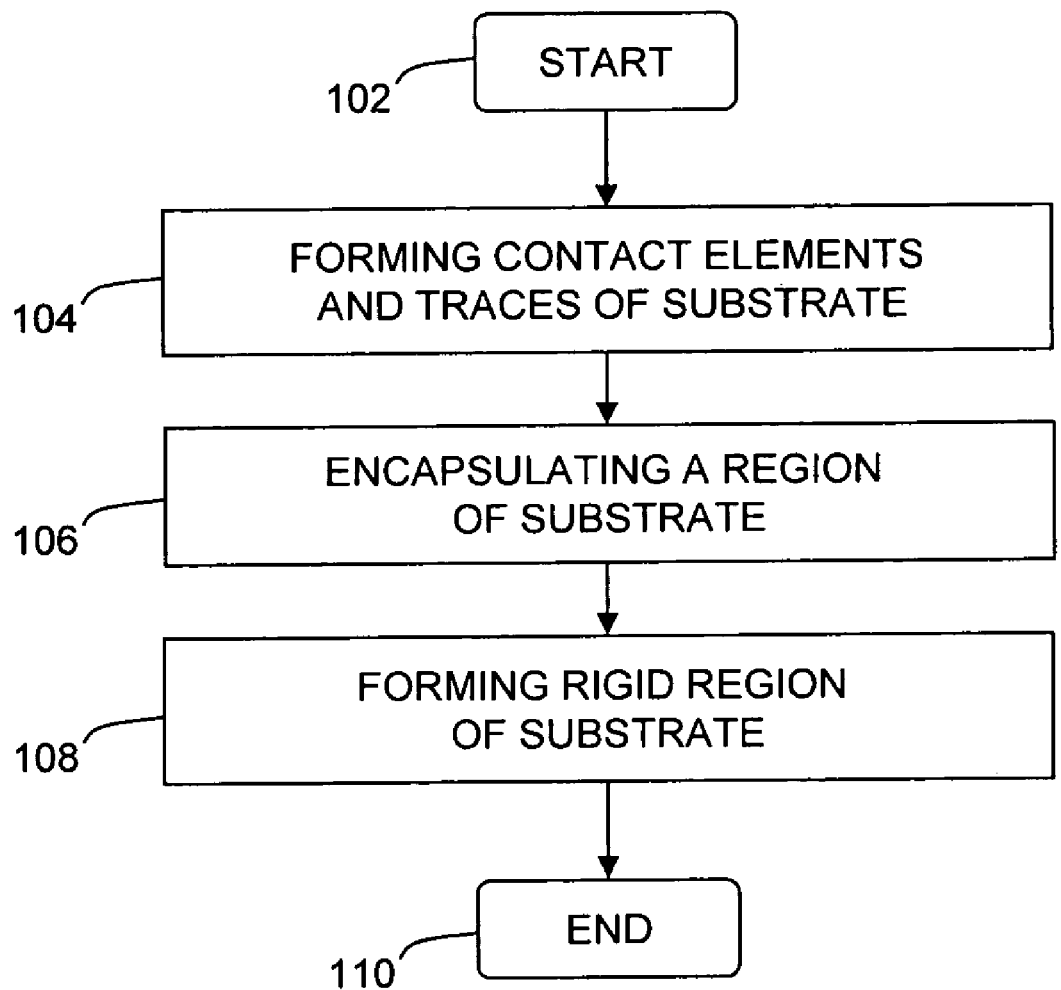
FIG. 1 is a flow diagram illustrating a method for fabricating a substrate in accordance with one embodiment of the present invention.

Herein, identical reference numerals are used, where possible, to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

FIG. 1 depicts a flow diagram illustrating a method 100 for fabricating a flexible substrate for a microelectronic assembly in accordance with one embodiment of the present invention.

The method 100 includes processing steps performed during fabrication of a substrate for a microelectronic assembly. In some embodiments, these processing steps are performed in the depicted order. In alternate embodiments, at least two of these steps may be performed contemporaneously or in a different order. Sub-steps and auxiliary procedures (e.g., substrate transfers between processing reactors, substrate cleaning sub-steps, process control sub-steps, and the like) are well known in the art and, as such, herein are omitted. Cross-sectional views in the drawings below are taken along a line 1-1 (shown in FIGS. 2A and 2I only) of conductive plates of substrates being fabricated using embodiments of the method 100.

The method 100 starts at step 102 and proceeds to step 104. At step 104, the method uses at least one conductive plate 200 for manufacturing electrical elements of a substrate being fabricated (FIGS. 2A-2B). In a particular embodiment, the plate 200 is fabricated principally from copper (Cu) and may have a width 202 in a range from about 5 to 50 mm, a length 204 in a range from about 10 to 500 mm, and a thickness 206 in a range from about 10 to 500 µm (e.g., 25-40 µm).

The conductive plate 200 may include a relatively thick top layer 200A of an etchable material such as copper, a thin etch-stop 200B, formed from another metal, such as nickel, and a bottom layer 200C from an etchable material, such as copper.

Figure 2C:
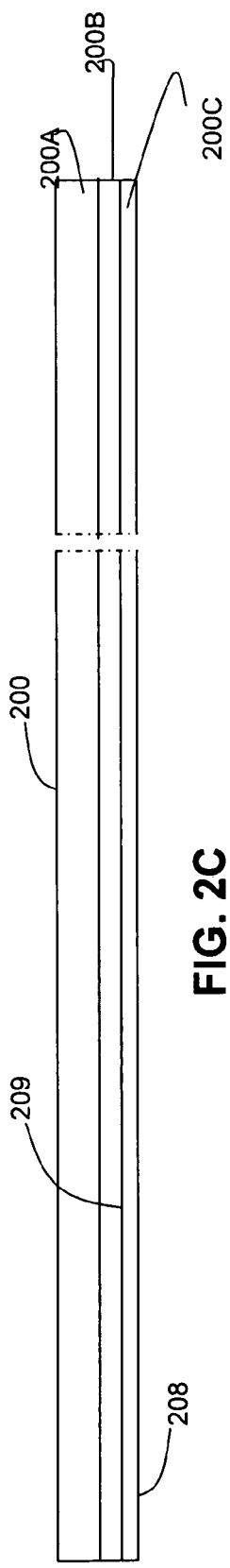
Figure 2D:
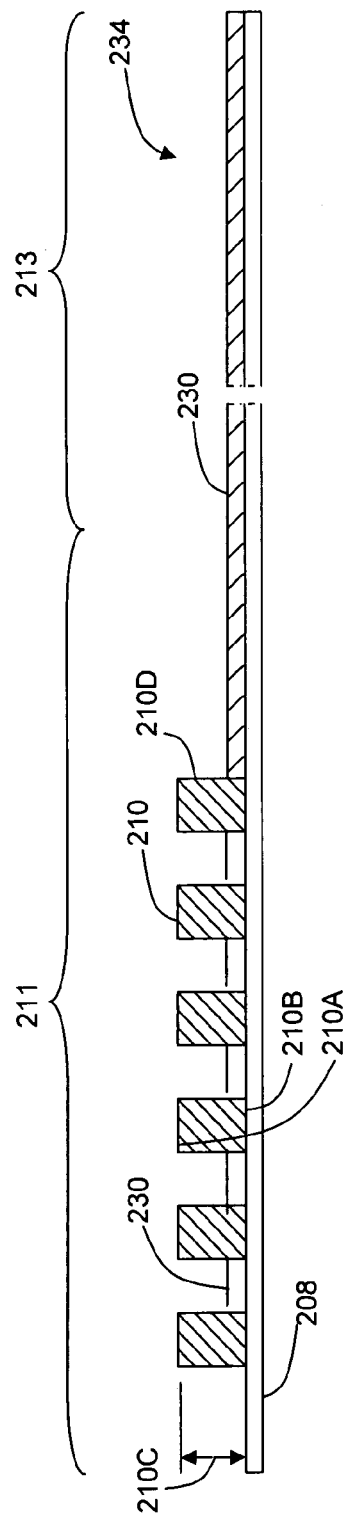

In one variant, a flexible first dielectric film 208 is deposited on a bottom surface 209 of the plate 200, thereby forming a dielectric structure of the substrate being fabricated (FIG. 2C). Then, the plate 200 is patterned and etched to form contact elements, such as contact pins 210 (depicted as hatched areas) and unitary conductive traces 230 (FIGS. 2D and 2I). For example, the pins 210 may be formed by depositing a photoresist on the top layer 200A only in the areas where the pins are to remain and etching away the top layer in other locations. The etch-stop layer 200B is then removed using a different etchant whereupon the bottom layer 200C is selectively patterned with a photoresist and etched to leave the traces. Other processes for forming pins and traces on a dielectric layer can be used. Reference is made to U.S. Pat. Nos. 6,782,610 and 6,826,827, as well as U.S. patent application Ser. No. 10/959,465, which are incorporated by reference in their entirety.

In a specific embodiment, the etch process uses the first dielectric film 208 as an etch stop layer to determine the duration of time for etching the plate 200. In variants (not shown), the pins 210 may be plated on the traces 230, as well as both the pins 210 and traces 230 may be plated on the first dielectric film 208 or be formed using a combination of plating and etch processes.

The pins 210 are disposed in a first region 211, and the traces 230 are disposed in both the first region 211 and an adjacent second region 213 of the dielectric film 208. In particular, the traces 230 are elongated strips extending from the first region 211 into the second region 213, as shown in FIG. 2I below.

In the first region 211, the traces 230 are selectively connected to bases 210B of the respective pins 210. A length of first region 211 is defined based on dimensions of microelectronic devices to be mounted on the substrate being fabricated, whereas a length of the region 213 is determined by a location of the substrate within an apparatus where such a substrate is used, as discussed below in reference to FIGS. 7A-7G.

The pins 210 are disposed at predetermined locations facilitating connection between the pins and terminals of the microelectronic device(s) to be mounted on the substrate. While the pins 210 are depicted herein as cylindrical columns, pins having different form factors have been contemplated and are within the scope of the present invention. For example, the pins 210 may have sidewalls 210D that are sloped, as well as the sidewalls having rectangular or elliptical cross-sections. Reference is also made to U.S. Pat. No. 6,268,231 which is incorporated by reference in their entirety. Widths of tips 210A and bases 210B and heights 210C of the pins 210 are generally selected in a range from about 50 to 500 μm, 75 to 500 μm, and 10 to 500 μm, respectively. In one particular embodiment, the widths of the tips and bases and heights of the pins 210 were 100, 125, and 250 μm, respectively.

Distances between the adjacent pins (i.e., pitch) generally correspond to the ones between terminals of the microelectronic devices to be mounted on the substrate and typically are in a range from 200 to 1000 μm, whereas widths of the traces 230 are typically selected in a range from about 5 to 100 μm (e.g., 20-40 μm). As such the width of the traces 230 may be substantially smaller than the widths of the bases of the pins 210 or the distances between the adjacent pins, thus facilitating high routing density in the region 211 and 213 of the substrate.

Typically, each trace 230 is connected to a base of at least one pin 210 or to at least one other trace, as illustratively depicted in FIG. 2I below. However, some traces may "float," i.e., be electrically disconnected from pins and other traces of the substrate. Likewise, one or more pins 210 may remain unconnected to the traces 230, although typically most or all of the pins are connected to the traces.

Together, the pins 210 and traces 230 form an electrical circuit of the substrate. In the depicted embodiment, the traces are further provided in the second region 213 with contacts 232 (e.g., etched contacts). The contacts 232 are used to provide electrical connectivity between the substrate being fabricated and external circuits.

At least some of the pins 210, contacts 232, or traces 230 may be provided with an optional coating (not shown), for example, gold (Au) coating, to enhance their conductivity, connectivity, and resistance to corrosion.

Figure 2E:
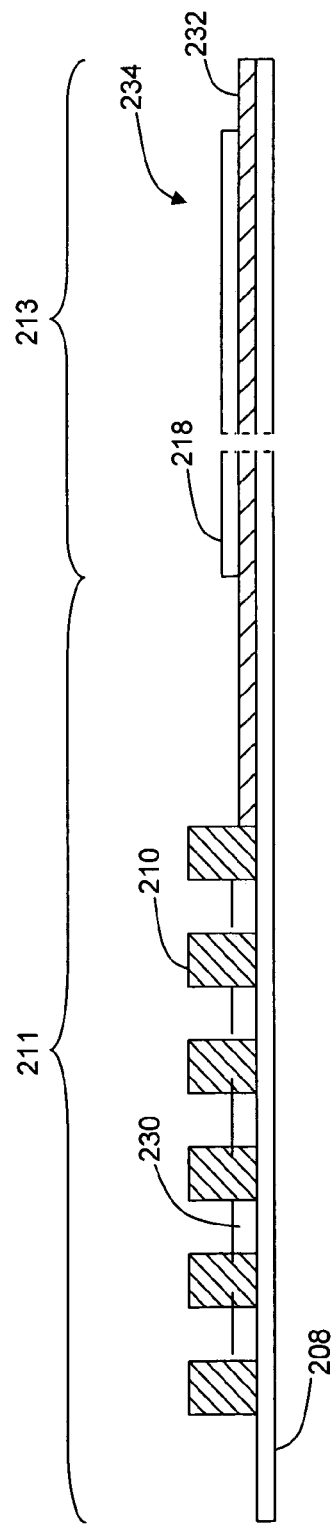

At step 106, a flexible second dielectric film 218 is formed in the region 213 over the traces 230, with the exception for the contacts 232 (FIG. 2E). Generally, the films 208 and 218 are formed from the same material (for example, polyimide and the like) and bonded together (e.g., molded or otherwise thermally, mechanically, or chemically processed) to encapsulate the traces 230. Together, in the region 213, the traces 230 and films 208, 218 form a flexible portion 234 of the substrate being fabricated.

Figure 2F:
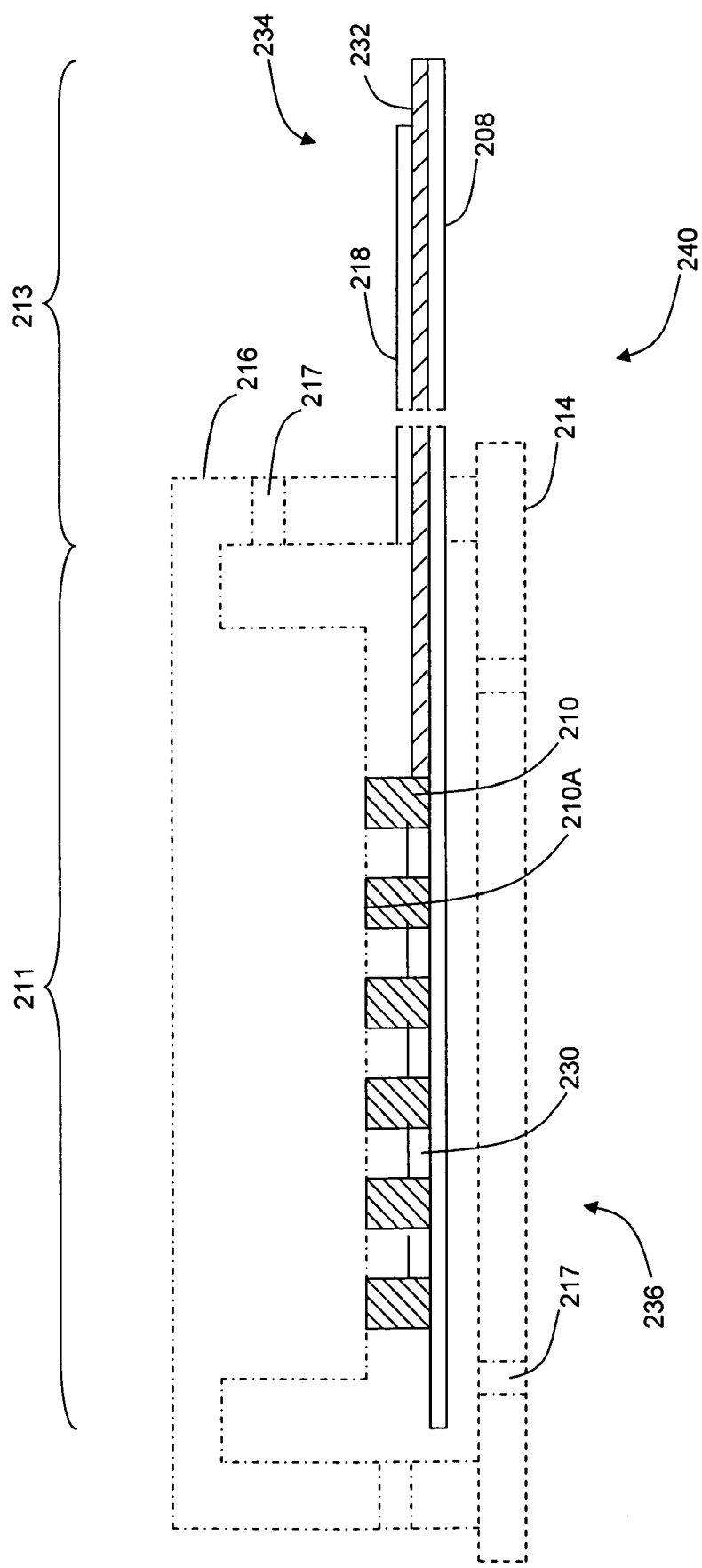
Figure 2G:
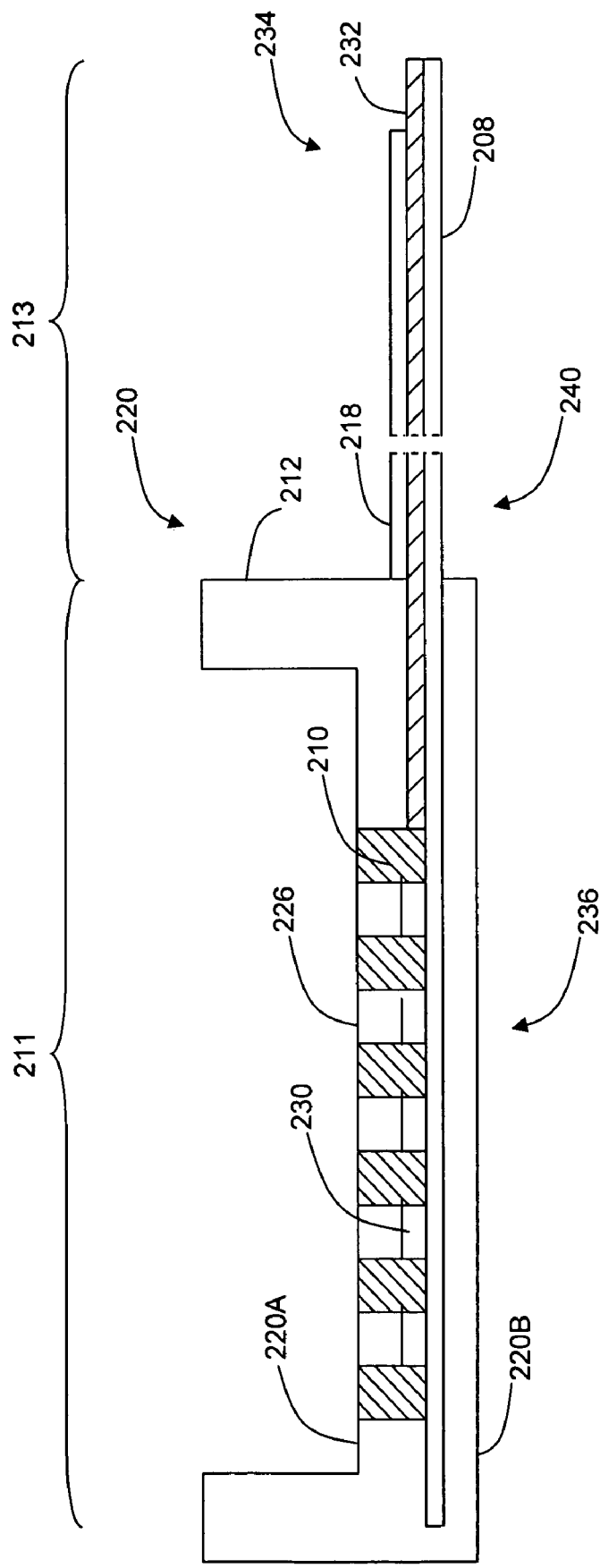
Figure 2H:
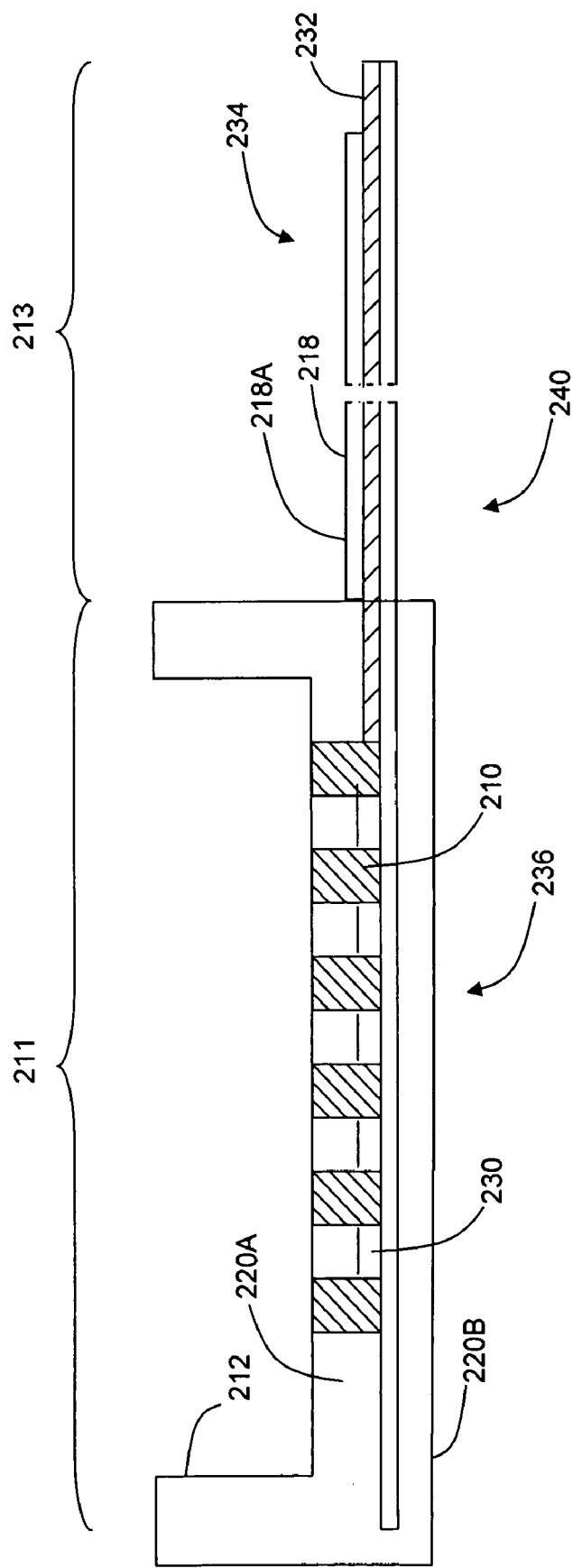
Figure 2I:
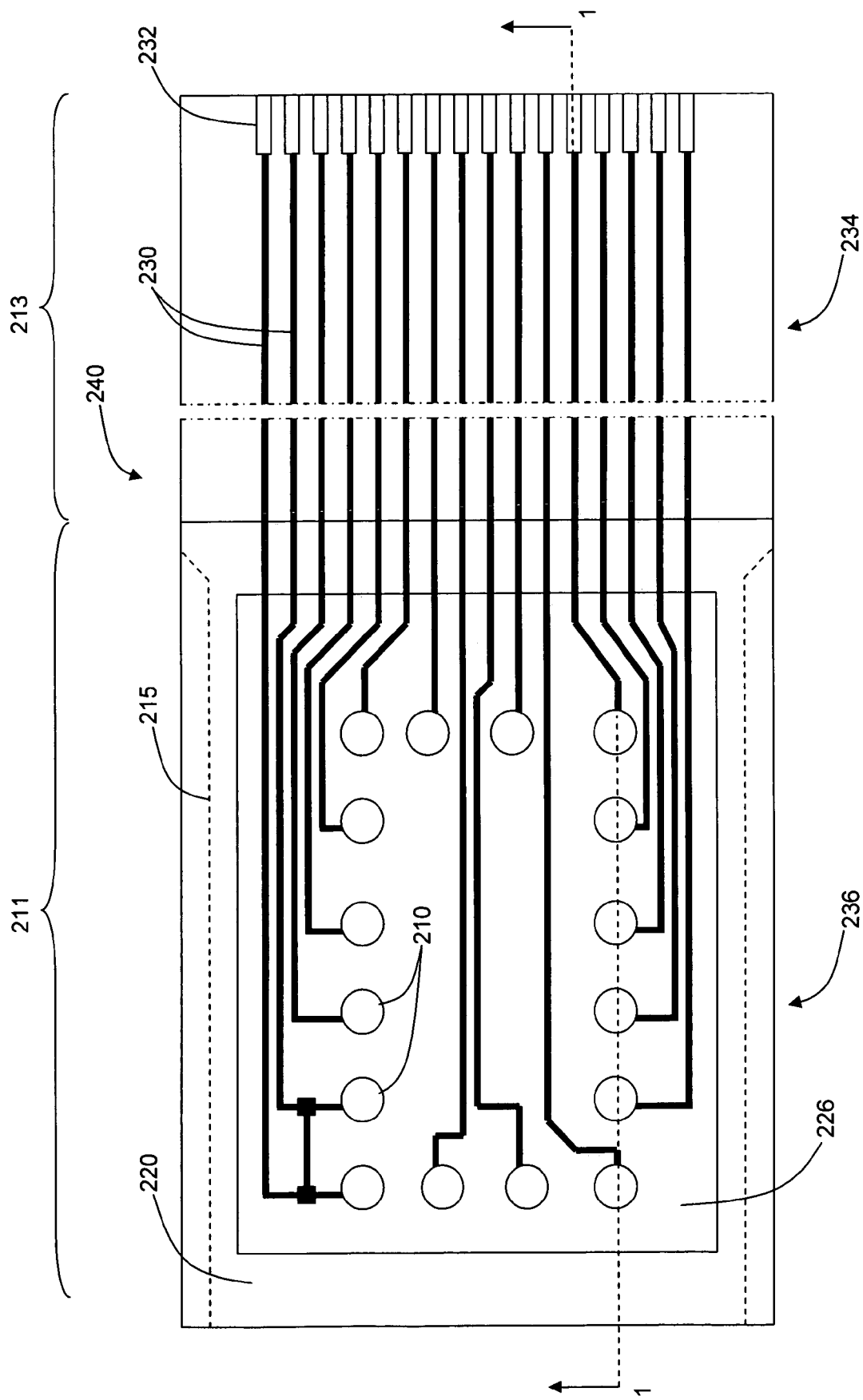

At step 108, a dielectric enclosure 220 is fabricated from a first dielectric encapsulant in the region 211 using a molding process, a curing process, or a combination thereof (FIGS. 2F-2J). The enclosure 220 reinforces the dielectric structure 208 in the first region 211 so that the first region is more rigid than the second region 213. During fabrication of the enclosure 220 (illustratively, using the molding process), the circuit elements of the substrate, such as pins 210 and traces 230, and the underlying portion of the first dielectric film 208 are disposed between a press plate 214 (shown using broken lines) and a counter element 216 (shown using phantom lines) of a molding tool (FIG. 2F).

The counter element 216 is abutted against the tips 210A of the pins 210 and a flowable molding composition is injected or otherwise introduced into the space between the press plate 214 and counter element 216. Such molding process forms the enclosure 220 (FIG. 2G) having a bottom surface 226 coplanar with the tips of the pins 210 and embedding, in the region 211, the traces 230 and the dielectric film 208.

The composition may be essentially any material which will cure to a solid state and form a dielectric. For example, compositions which cure by chemical reaction to form a polymeric dielectric, such as epoxies, polyimides, or liquid crystal polymers may be used. In other cases, the flowable composition may be a thermoplastic at an elevated temperature, which, by cooling, can be cured to a solid state. Preferably, the enclosure 220, after molding or curing, forms binding interfaces with the features (i.e., pins 210 and traces 230) of the substrate 240.

The composition may further include one or more additives influencing properties of the enclosure 220. For example, such additives may include particulate materials such as silica or other inorganic dielectrics, or fibrous reinforcements such as short glass fibers.

In the depicted embodiment, the molding composition is injected through at least one opening, or gate, 217 in the counter element 216 and/or the press plate 214, whereas the remaining openings 217 are used as an escape passage for the trapped air or excess material of the molding composition.

Upon completion of the molding process, the press plate 214 and the counter element 216 are removed (FIG. 2G). The molded enclosure 220 comprises a top portion 220A encapsulating the pins 210 and traces 230 and a bottom portion 220B encapsulating the first flexible dielectric film 208. In a variant, the enclosure 220 may also be molded over a portion 218A of the second dielectric film 218 (FIG. 2H).

FIG. 2I depicts a top view of the substrate 240. For a purpose of graphical clarity, the traces 230 are shown in FIG. 2I using thick solid lines. However, the traces 230 are embedded, in the region 211, in the enclosure 220 and, in the region 213, disposed beneath the second dielectric film 218.

Ordinarily, at the completion of the molding step, the tips of the pins 210 are free from the molding composition. However, in some instances, a thin layer (not shown) of the molding composition may overlie the tips of some or all of the pins 210. If this occurs, such a layer can be removed by exposing the surface 226 to a brief plasma etching or ashing process which attacks and remove the layer. In a variant, to increase mechanical bonding between the portions 220A and 220B of the enclosure, a width of the dielectric film 208 in the region 211 may optionally be reduced, as illustratively depicted in FIG. 2I using a broken line 215. Exposing pins 210 and 230 facilitates a better connection. Thus, the pins 210 will be "exposed at" the surface after the completion of the molding step. As used in this disclosure, a metallic feature can be considered "exposed at" a surface of a dielectric layer if the metallic feature is accessible to a contact or bonding material applied to such surface. Thus, a metallic feature which projects from the surface of the dielectric, such as pins 210 or traces 230, or which is flush with the surface of the dielectric is also "exposed at" the surface.

In the particular embodiment, the top portion 220A of the enclosure includes a peripheral wall 212 projecting from the dielectric structure and surrounding the region 211. As discussed below in reference to FIGS. 7A-7G, the wall 212 may be used to support a lid covering the enclosure 220 and/or comprising components facilitating operability of microelectronic devices mounted on the substrate 240.

Figure 2J:
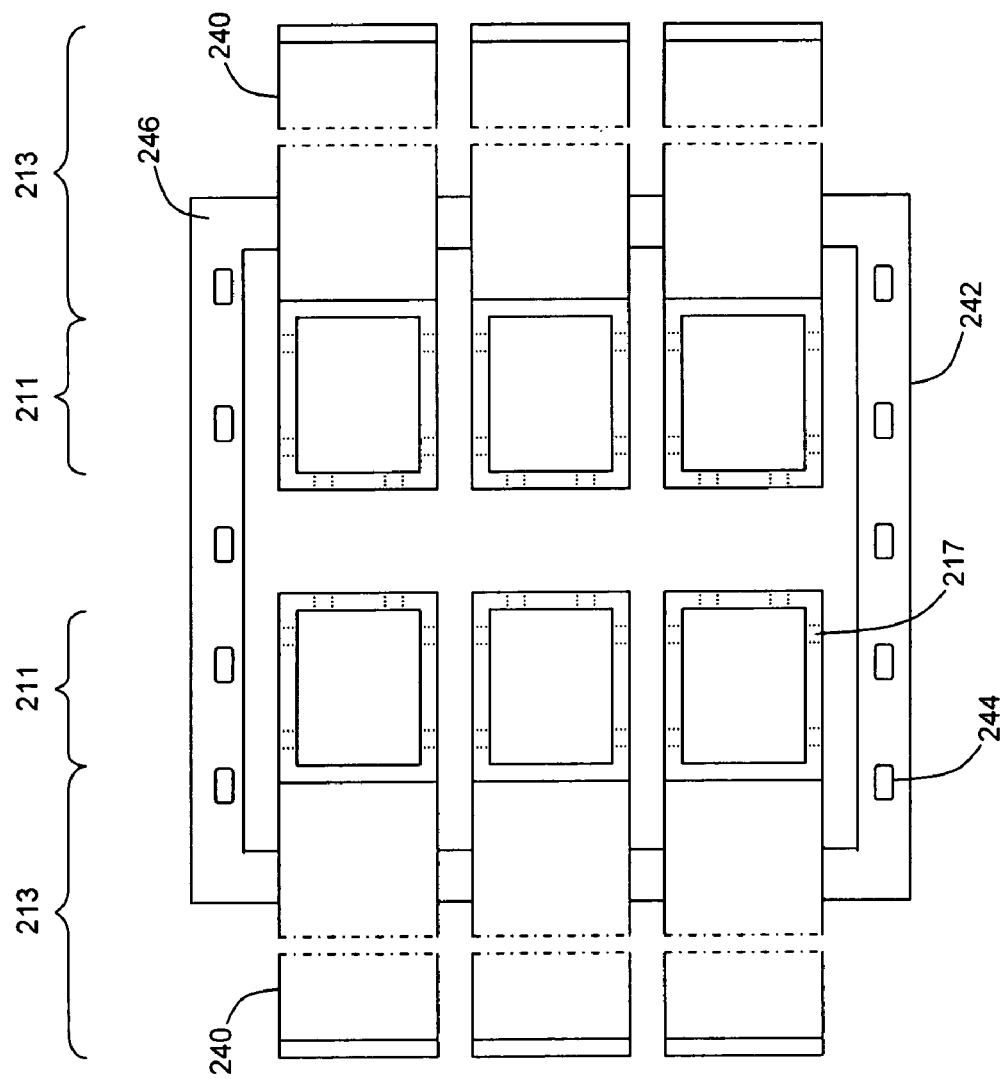

In another variant, the portions 236 of several substrates 240 may be molded simultaneously as illustratively shown in FIG. 2J, where a larger frame 242 incorporates a plurality of individual press plates 214. The frame 242 illustratively includes sprocket holes 244 and a peripheral wall 246. In this embodiment, the counter elements 216 of the molding tool are extended over the plate 242. During the molding process, the molding composition is introduced into the spaces between the component press plates 214 and counter elements 216 through individual gates 217 flowably coupled to a runner system of the molding tool.

After forming the portion 236 of the substrate 240, the method 100 ends.

Figure 3C:
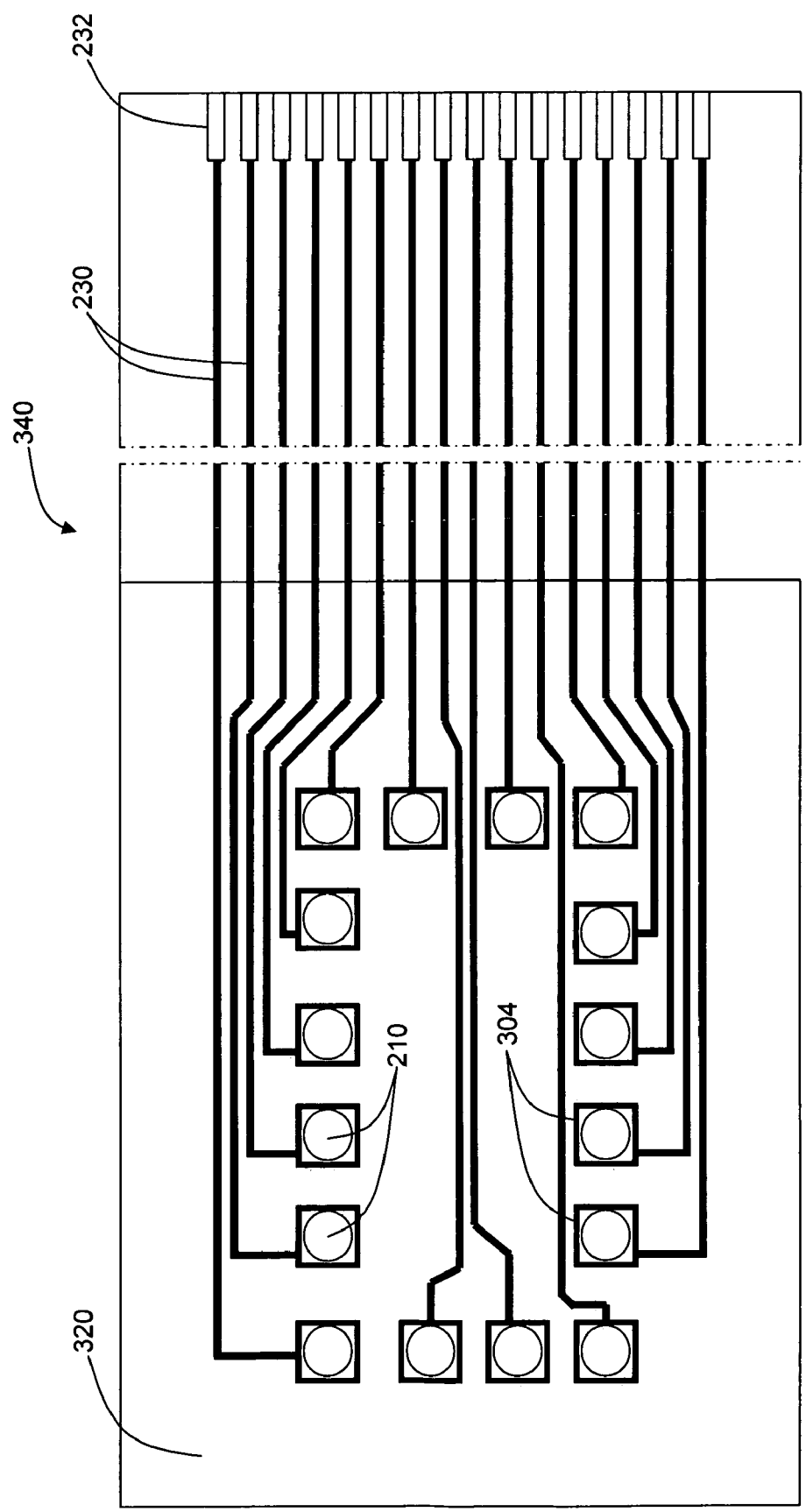

A substrate 340 according to another embodiment comprises a flat enclosure 320 (FIGS. 3A-3C). A process of molding the enclosure 320 is illustrated in FIG. 3A. In the depicted embodiment, during the molding process, the tips 210A of the pins 210 are in a contact with an inner surface 302 of a counter plate 316. Together with the press plate 214, the counter plate 316 forms a molding cavity for molding the enclosure 320. An upper surface 326 of the molded enclosure 320 is coplanar with the tips of the pins 210 (FIG. 3B). In FIG. 3C depicting a top view of the substrate 340, the traces 230 are shown terminated with optional contact areas 304, which totally (as shown) or at least partially surround bases of the respective pins (traces 230 and areas 304 are shown using thick solid lines).

Figure 4C:
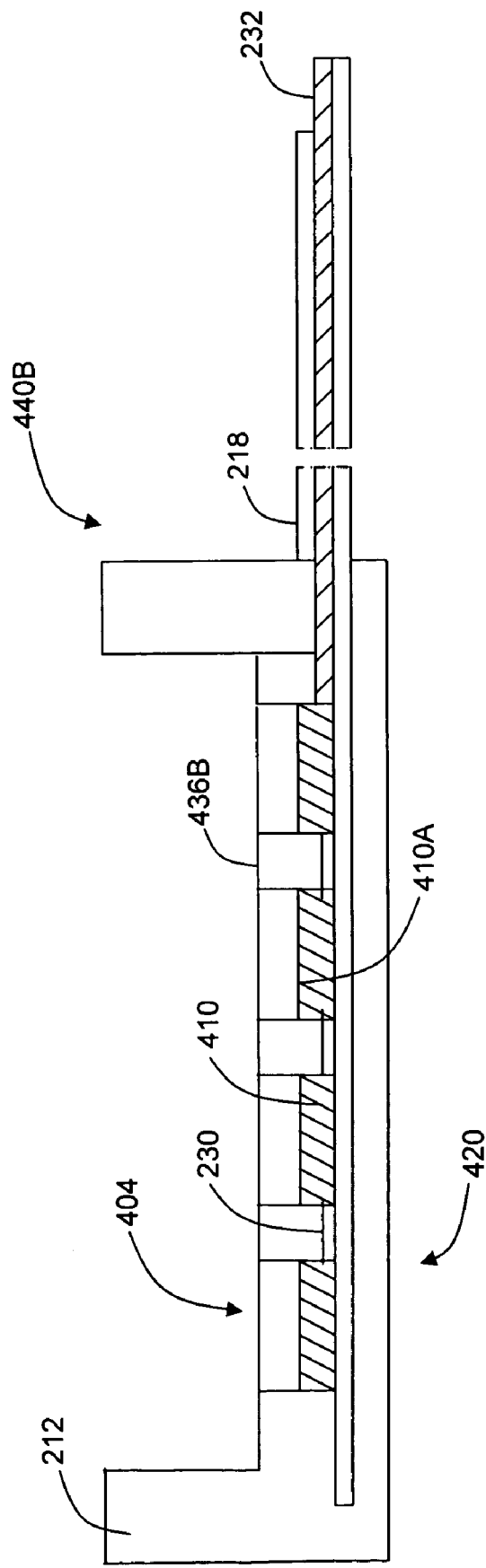

Substrate 440A and 440B according to another embodiment comprise contact elements in a form of contact pads 410 (FIGS. 4A-4D). The pads 410 have larger tips and larger bases than the ones of the pins 210, thereby allowing for greater manufacturing tolerances during mounting of microelectronic devices onto such substrates (FIG. 4A). For example, widths of the tips 410A and bases 410B of the pads 410 are generally selected in a range from 500 to 1000 µm, whereas a height 410C of the pads is typically in a range from 10 to 500 µm. The height 410C of the pads 410 may be greater than the height of the traces 230 (as illustratively shown in FIGS. 4A-4C), as well as equal or smaller (not shown) than the height of the traces 230. Such pads 410 may be formed (for example, etched or plated) using the same processes as discussed above in reference to fabrication of the pins 210.

Figure 4D:
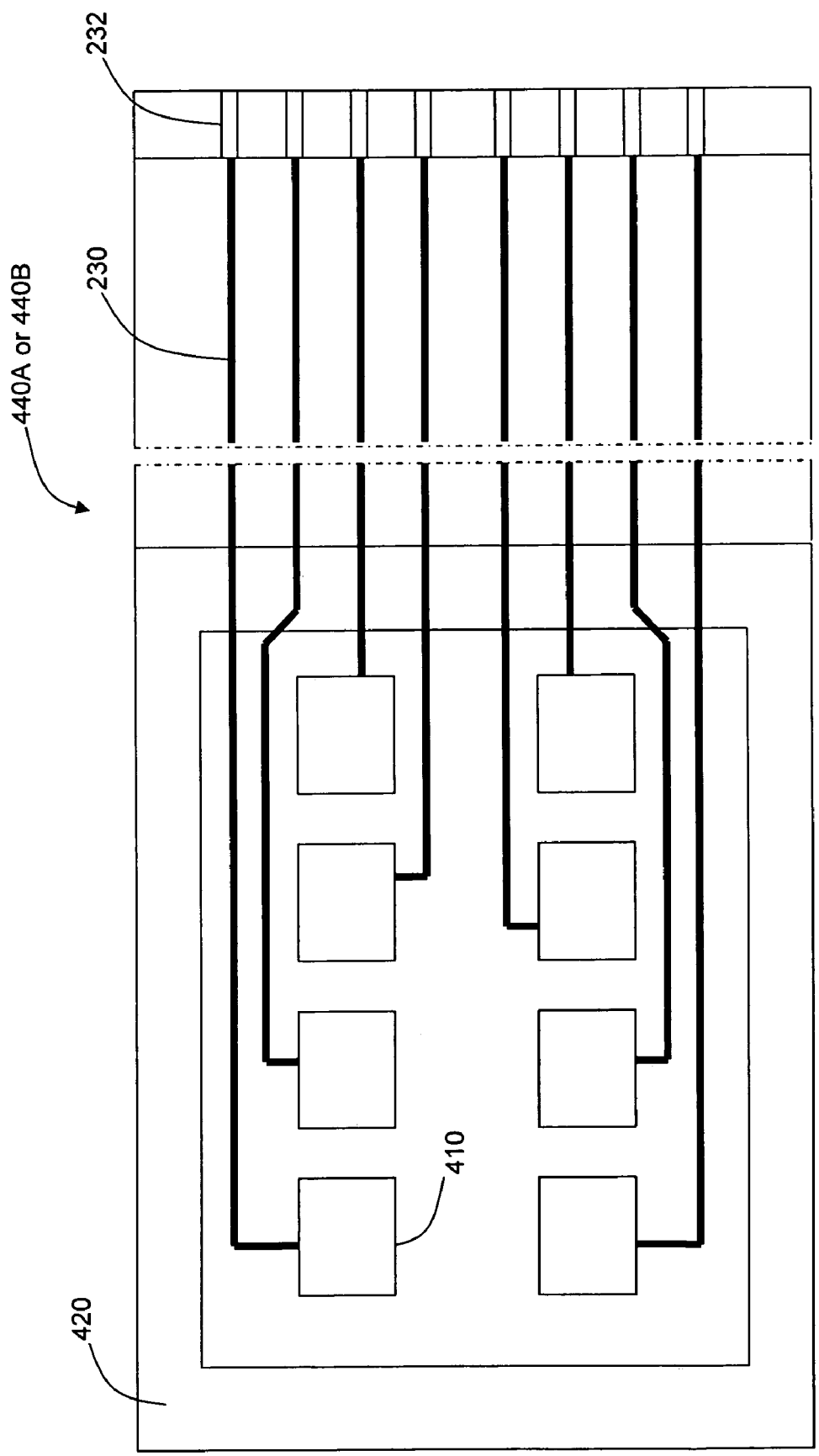

In an embodiment depicted in FIG. 4B, an upper surface 426A of a molded enclosure 420A is coplanar with the tips 410A of the pads 410 of the substrate 440A. In another embodiment depicted in FIG. 4C, an upper surface 426B of the enclosure 420B is disposed above the tips 410A of the pads 410, and the pads 410 are accessible through openings 404 in the surface 426B. Such openings 404 may be formed, for example, during the molding process that uses a molding tool where a counter plate includes columns matching the openings 404. Alternatively, the openings 404 may also be etched or mechanically machined in the enclosure 420. FIG. 4D depicts a top view of the substrate 440A or 440B (traces 230 are shown using thick solid lines). In a further embodiment (not shown), the contact elements may include some contact pads and some contact pins.

Figure 5C:
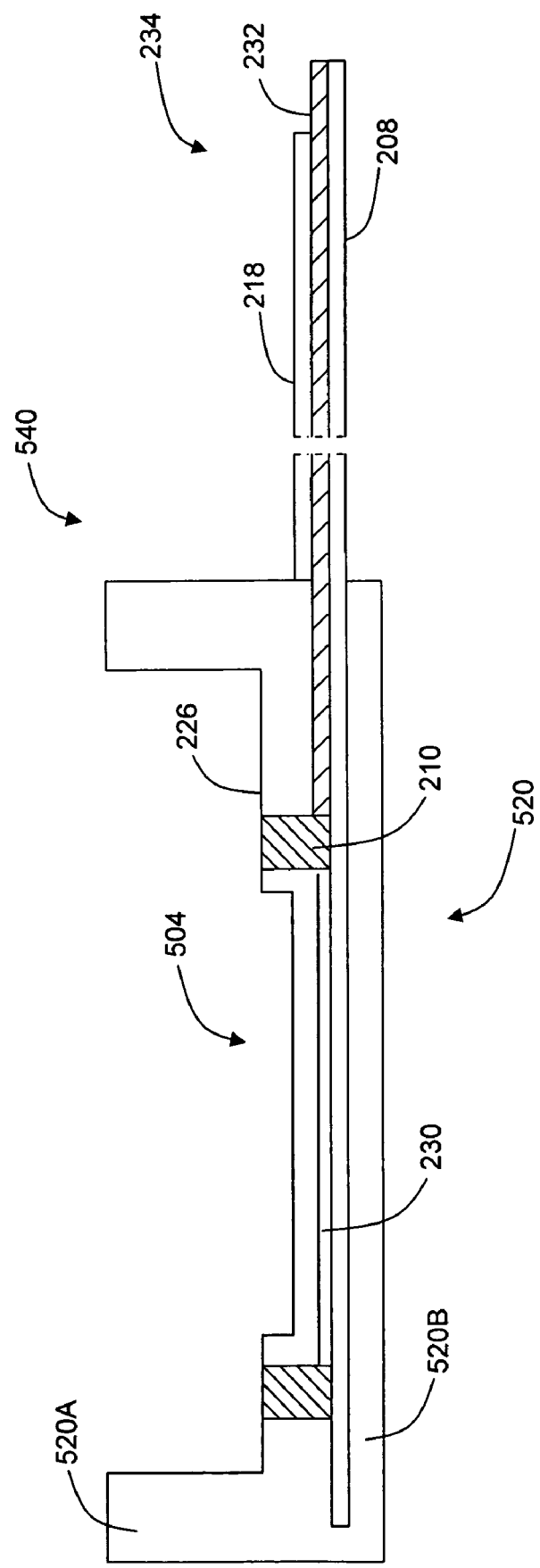

A substrate 540 according to another variant comprises a dielectric enclosure 520 having a recess 504 disposed in region 501 of the enclosure (FIGS. 5A-5C). The recess may be adapted for receiving microelectronic devices mounted on the substrate 540. In the depicted embodiment, the contact elements (illustratively, pins 210) are horizontally offset from the recess 502 (FIG. 5A). In further embodiments (not shown), the traces 230 may also be offset from the recess, as well as the recess may be extended from an upper portion 520A into a bottom portion 520B of the enclosure. The recess 504 may be fabricated, for example, during the molding process using a counter plate 516 provided with a step 502 that matches the recess to be formed, as well as the recess may be etched or mechanically machined in the enclosure 520 (FIG. 5B-5C).

Figure 6A:
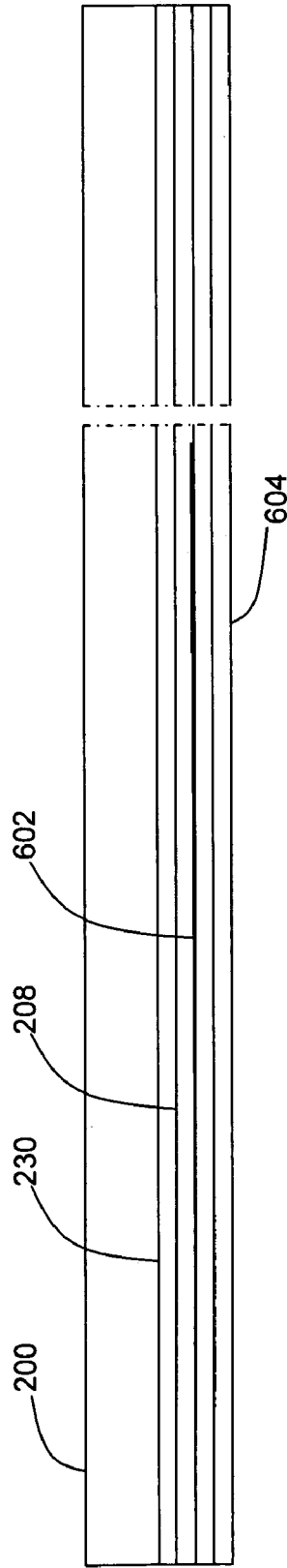
FIGS. 6A-6C are schematic, cross-sectional views of portions of a substrate during successive stages of a method according to a further embodiment of the invention.
Figure 6B:
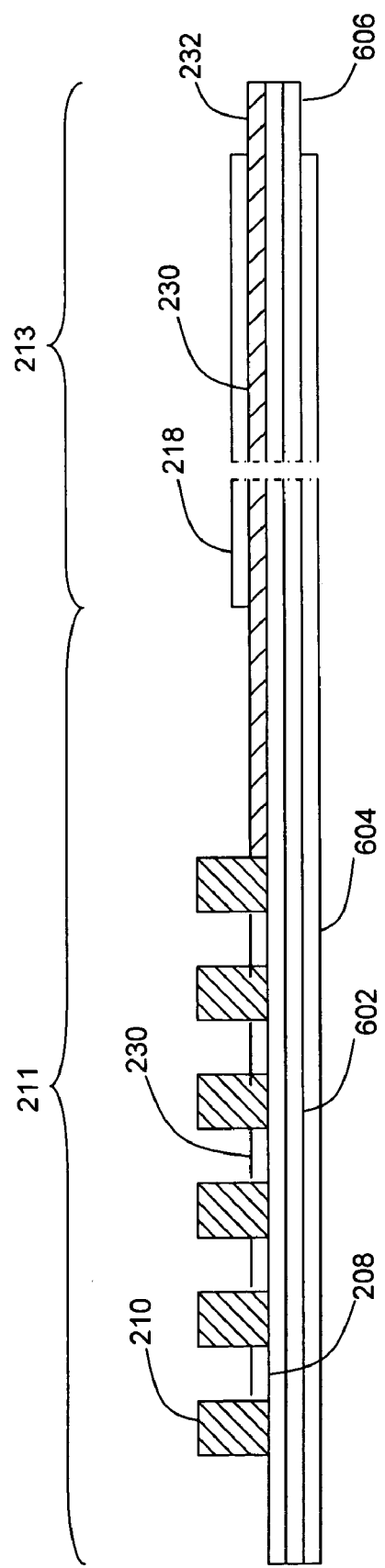
Figure 6C:
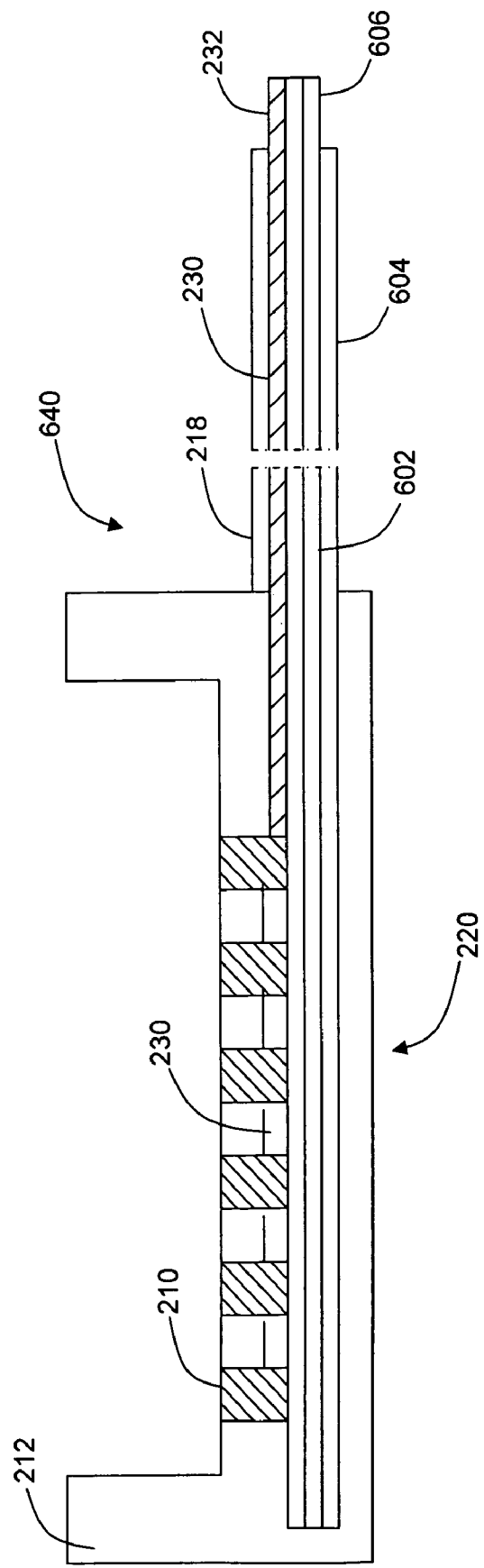

A substrate 640 according to another variant comprises a conductive layer 602 and a third dielectric layer 604, which are consecutively formed on the first dielectric layer 208 (FIGS. 6A-6C). The layer 602 is provided with an electrical contact 606 for connecting to a circuit external to the substrate 640 (FIG. 6B). During the molding process, in the region 211, the enclosure 220 encapsulates the layers 602 and 604 (FIG. 6C). In operation, the conductive layer 602 may be used as a shield protecting the circuits of the substrate 640 from electromagnetic interference (EMI) caused by external circuits.

Substrates fabricated according to yet further embodiments of the method of FIG. 1 may comprise various combinations of the features discussed above in reference to the substrates 240, 340, 440A-440B, 540, and 640. For example, the substrates 240, 340, 440A-440B, and 640 may include recesses, like those included in the substrate 540. Being single-unit packaging platforms comprising integrated flexible and rigid portions (e.g., portions 234 and 236 in the substrate 240), the inventive substrates advantageously overcome many deficiencies of the prior art.

FIGS. 7A-7G depict exemplary microelectronic assemblies 701-707 using the substrate fabricated according to embodiments of the present invention. Microelectronic elements, or devices, are electrically connected to contact elements and may be mounted on the substrates using a ball bonding technique (also known in the art as a flip-chip technique) and/or a wire bonding technique. The devices mounted on the substrates are collectively denoted herein using the same reference numeral 720, except that, in FIG. 7G, the suffixes "A"-"D" have been added to differentiate between the individual devices. The devices 720 may include various electronic or opto-electronic sensor arrays, micro-electromechanical systems (MEMS), and other microelectronic chips used in digital cameras, cellular phones, laptop computers, finger print readers and the like products or component subassemblies of such or other products.

In the depicted assemblies, the devices 720 may additionally or optionally be affixed to the respective enclosures using, for example, an adhesive compound, be at least partially encapsulated within the enclosures using a protective compound, or the enclosures and the mounted devices may be at least partially encapsulated using the protective compound. Such adhesive and protective compounds and methods of their application are known in the art and therefore are not shown in the FIGS. 7A-7G.

Figure 7A:
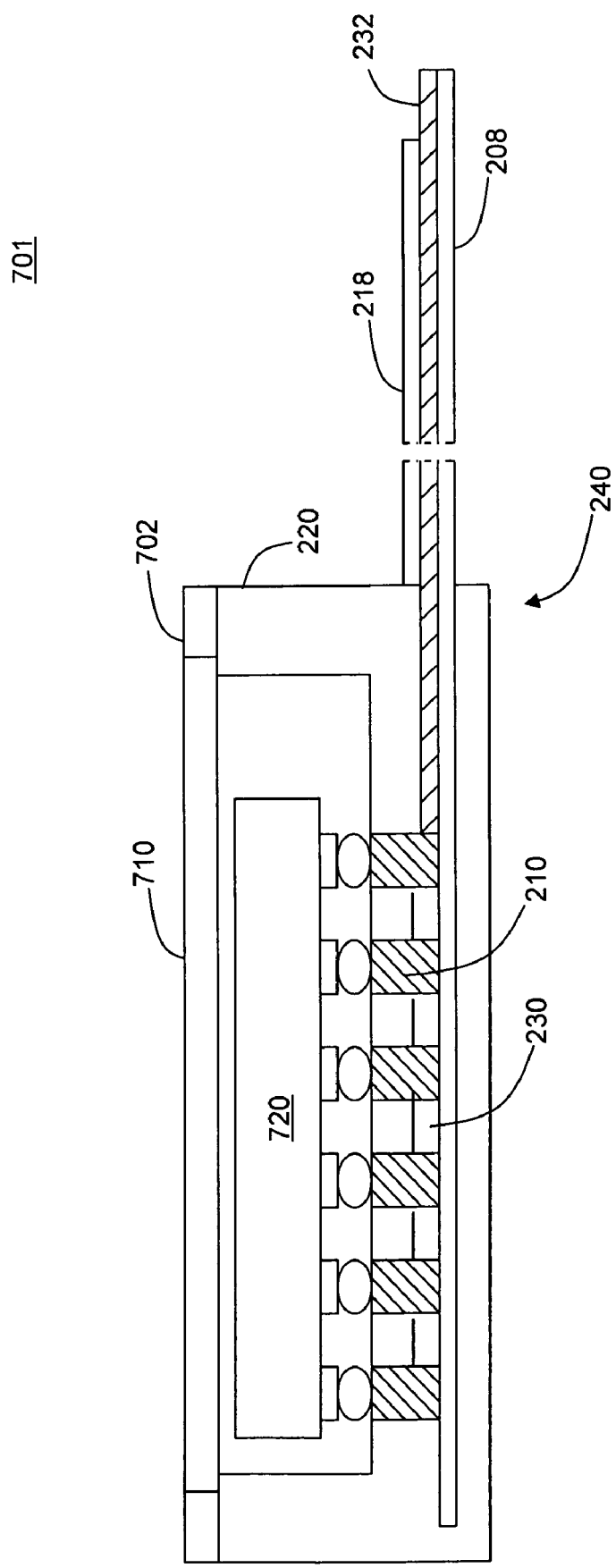
FIGS. 7A-7G are schematic, cross-sectional views of exemplary microelectronic assemblies using the substrates fabricated according to embodiments of the invention.
Figure 7B:
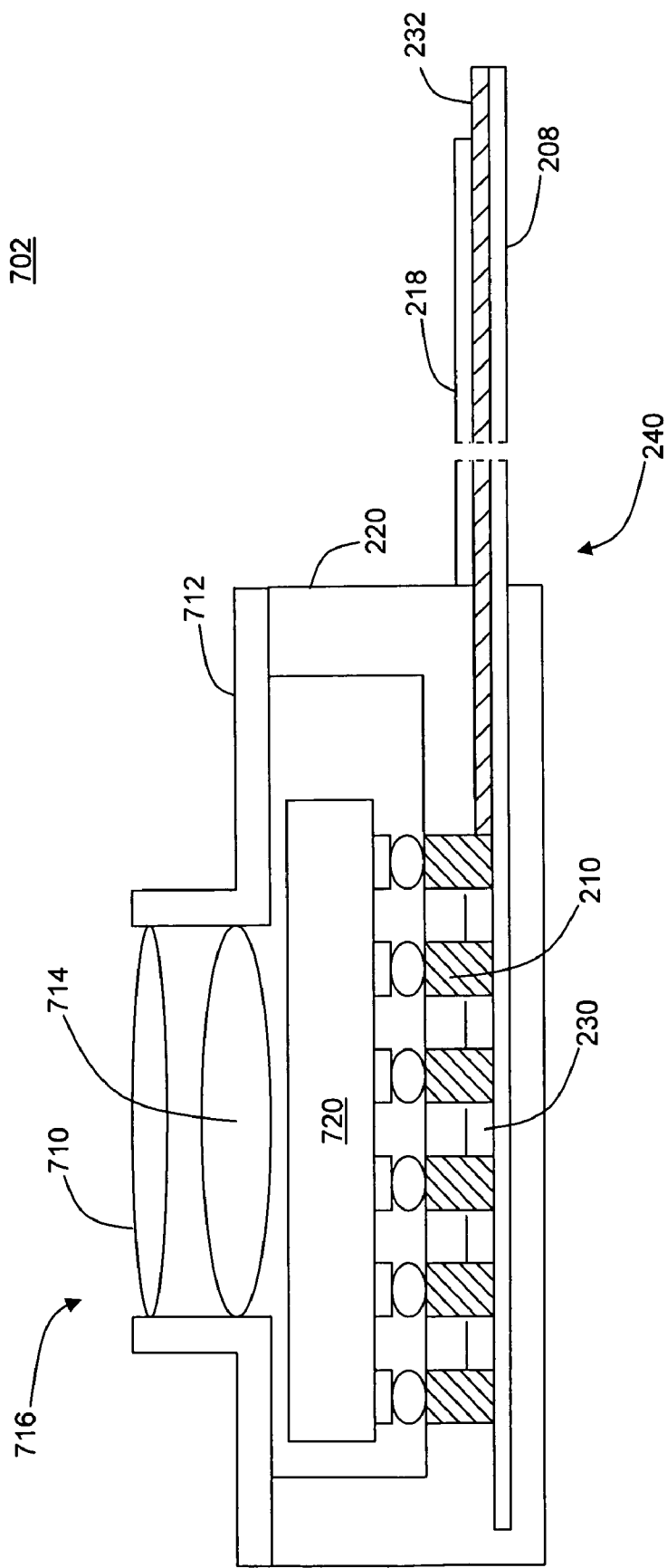
Figure 7C:
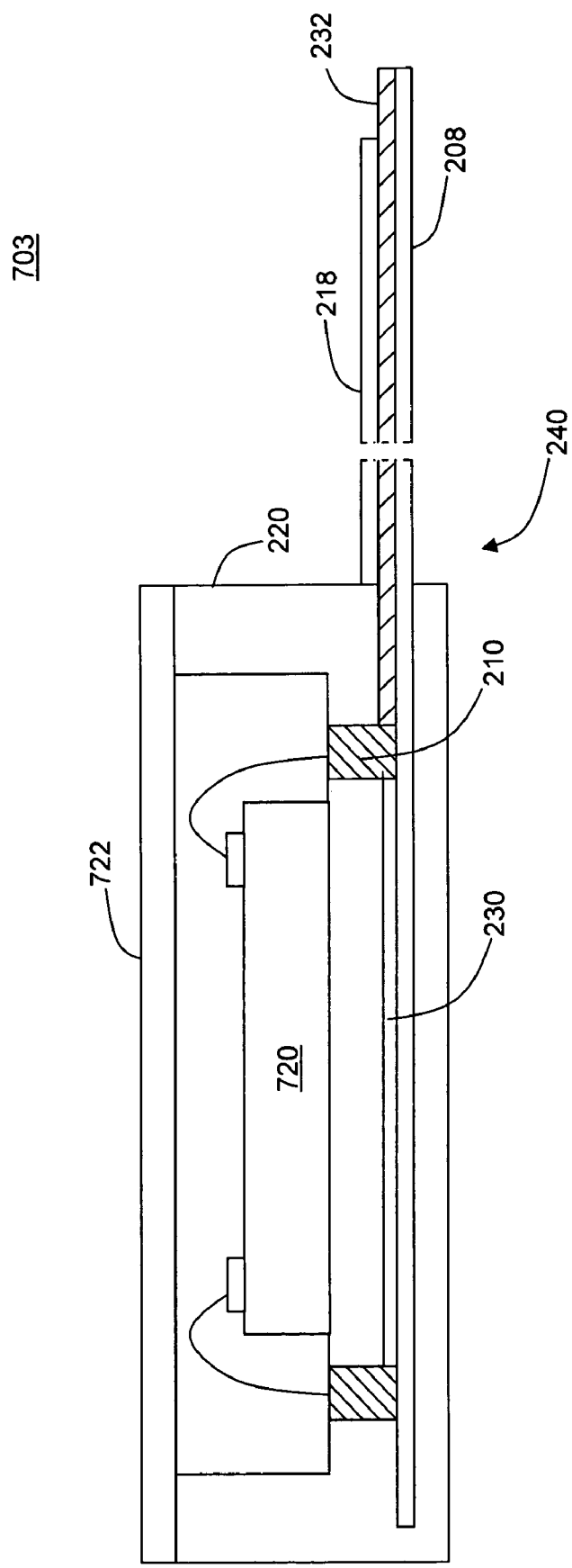
Figure 7D:
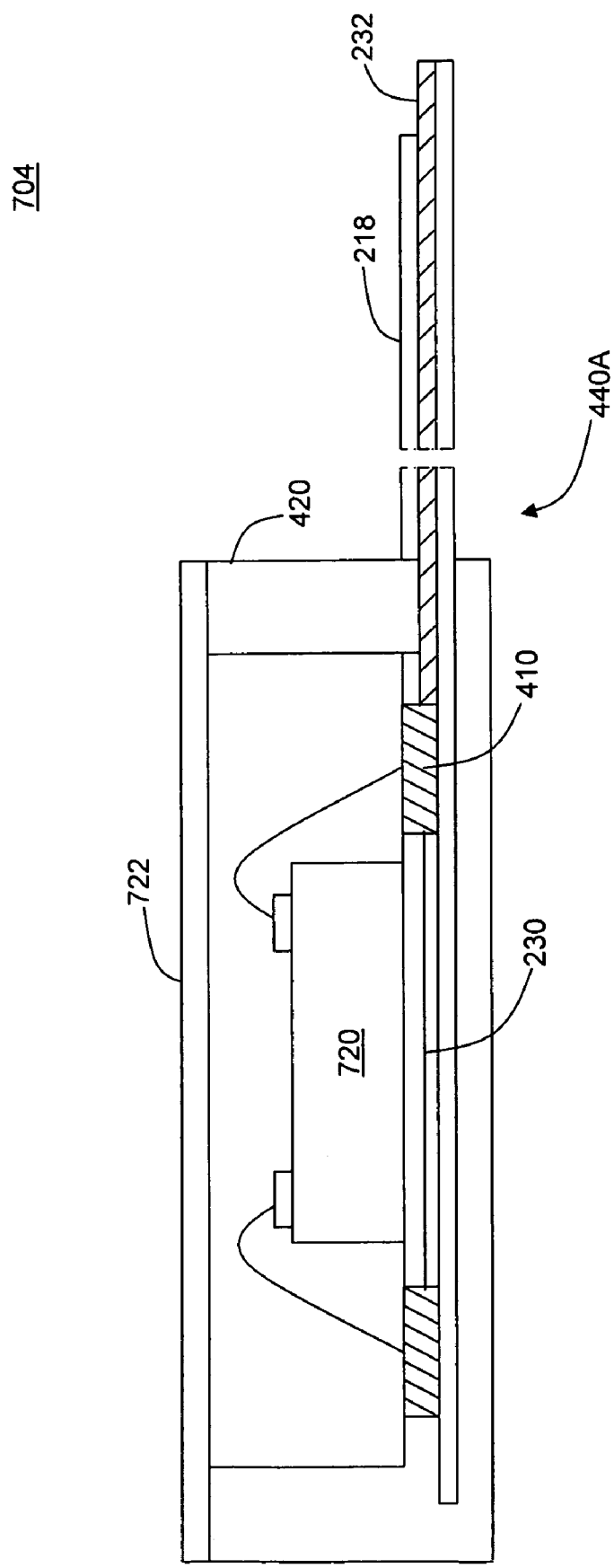
Figure 7E:
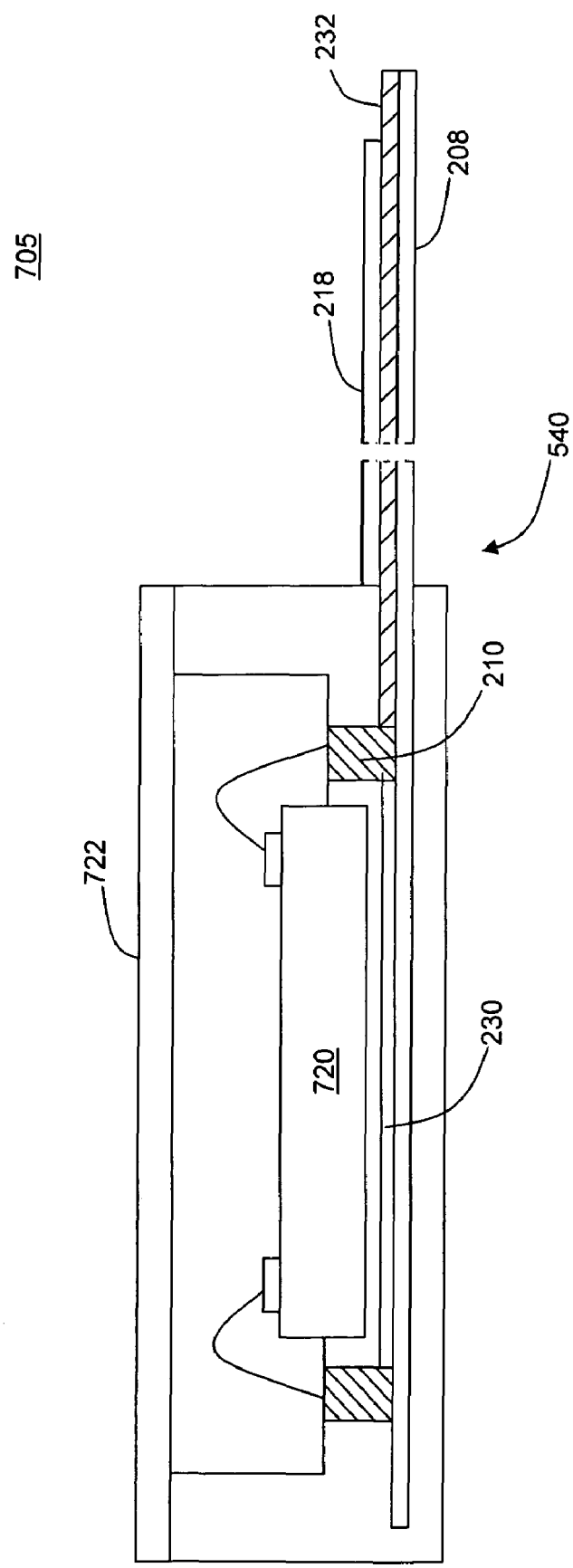
Figure 7F:
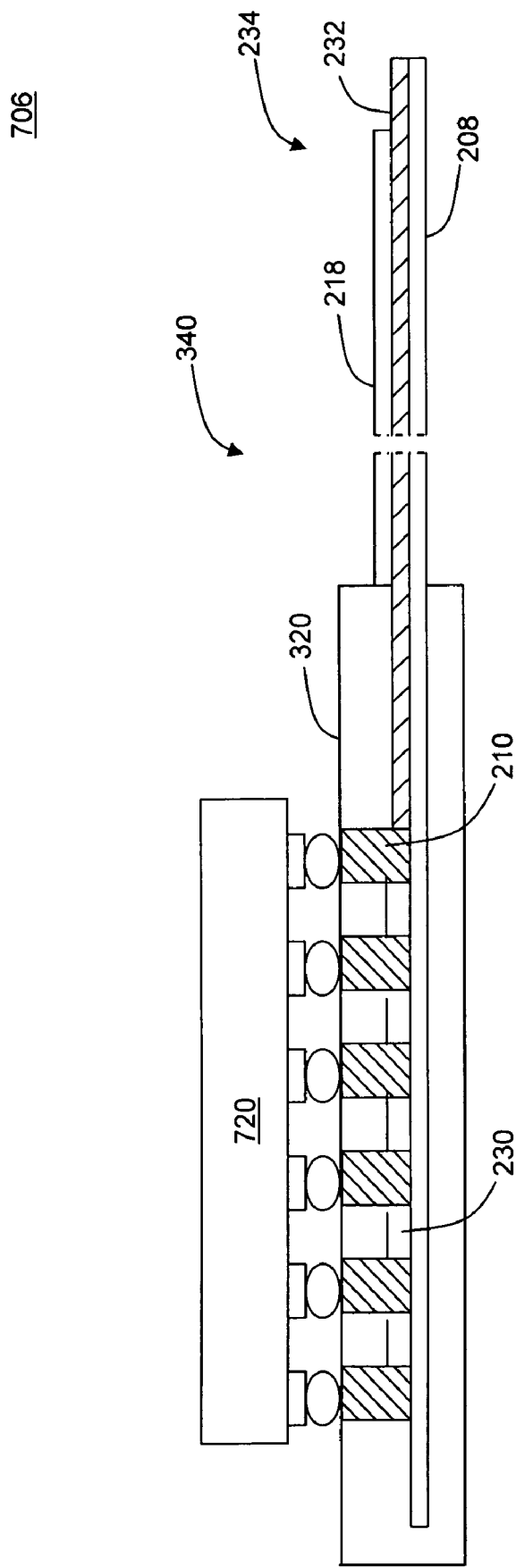
Figure 7G:
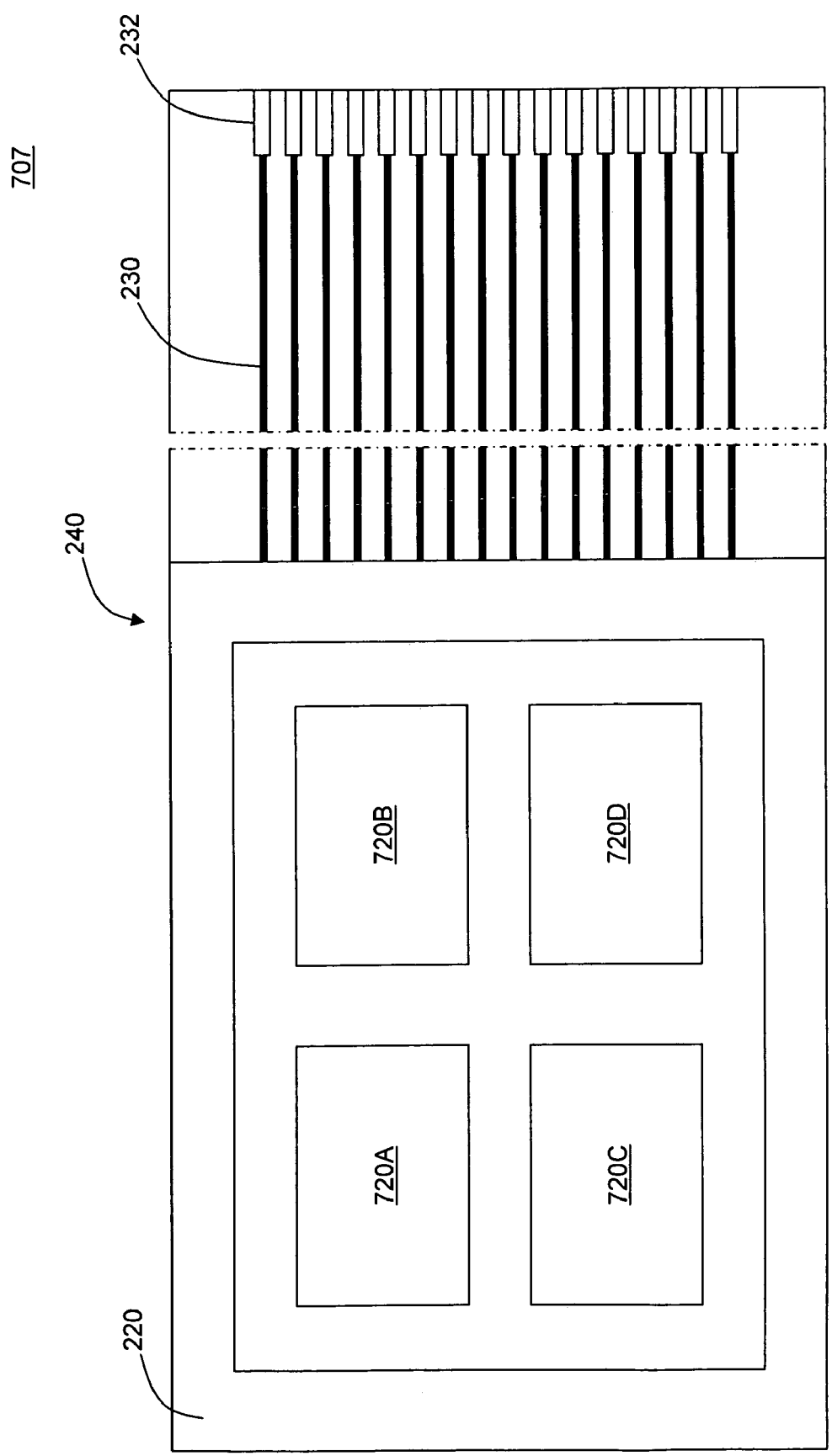

The FIGS. 7A-7G depict exemplary microelectronic assemblies, or units, 701-703 each comprising the substrate 240 having a plurality of contact pins 210 adapted for connecting to corresponding terminals of the devices 720 using a flip-chip technique (i.e., solder-bonded to the respective terminals) as depicted in FIGS. 7A-7B or using a wire bonding technique (FIG. 7C). Accordingly, FIGS. 7D and 7E depict the assemblies 704 and 705 comprising the substrates 440A (FIG. 7D) and 440B (FIG. 7B), respectively, whereas the assembly 706 comprising the substrate 340 is shown in FIG. 7F. In the embodiment depicted in FIG. 7G, several devices 720 (illustratively, devices 720A-720D) are mounted on the same substrate 240.

Illustratively, in FIG. 7A, the enclosure 220 is provided with a lid 720 supporting a transparent window 710 to facilitate operability of the device 720 containing an array of opto-electronic cells. Correspondingly, in FIG. 7B, the enclosure 220 is shown with an attached optical assembly 716 including a housing 712 and lenses 710, 714. The assembly 716 may facilitate operability of the device 720 comprising, for example, a finger print sensor array or optical MEMS. In the assemblies 703-705 of FIGS. 7C-7E, a cover 722 may, for example, seal or mechanically protect the devices 720.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A substrate for use in a microelectronic assembly comprising:
   (a) a unitary dielectric structure having first and second regions, said dielectric structure bearing contact elements in said first region and bearing unitary traces extending between said first and second regions, at least some of said traces being connected to at least some of the contact elements; and
   (b) a first dielectric encapsulant disposed on said dielectric structure in said first region, said first dielectric encapsulant being disposed so that said contact elements are exposed at a surface of the first dielectric encapsulant in said first region.

2. The substrate as claimed in claim 1 wherein said first dielectric encapsulant reinforces said dielectric structure in said first region so that said first region is more rigid than said second region.

3. The substrate as claimed in claim 1 wherein the contact elements project from a first surface of said dielectric structure and at least a portion of the first dielectric encapsulant forms a layer covering at least a portion of the first surface in the first region, such layer having a top surface remote from the first surface of the substrate, tips of the contact elements being exposed at the top surface of the layer.

4. The substrate as claimed in claim 1 wherein at least a portion of the first dielectric encapsulant forms a wall projecting from said dielectric structure and surrounding at least a portion of the first region.

5. The substrate as claimed in claim 1 further comprising in the first region an optical component affixed to the wall.

6. The substrate as claimed in claim 1 further comprising a conductive shield disposed proximate to said dielectric structure.

7. The substrate as claimed in claim 1 wherein the contact elements are contact pins, contact pads, or a combination thereof.

8. The substrate as claimed in claim 1 wherein the contact elements and the traces are formed from at least one conductive plate.

9. The substrate as claimed in claim 1 wherein in the second region trace ends are provided with electrical terminals.

10. The substrate as claimed in claim 1 wherein widths of at least some of the traces are equal to or smaller than widths of bases of the contact elements, said bases disposed proximate said dielectric structure.

11. The substrate as claimed in claim 10 wherein at least some of the traces have contact areas at least partially surrounding the bases of the contact elements.

12. The substrate as claimed in claim 1 further comprising a second encapsulant flexibly encapsulating the traces at least in the second region.

13. The substrate as claimed in claim 1 further comprising a conductive shield disposed adjacent to said dielectric structure and having an exposed electrical contact.

14. The substrate as claimed in claim 1 wherein the first dielectric encapsulant is molded from an epoxy, a thermoplastic, polyimide, or liquid crystal polymer.

15. The substrate as claimed in claim 1 wherein the first dielectric encapsulant comprises a recess adapted for receiving at least one microelectronic device.

16. A microelectronic element connected to the substrate of claim 1, wherein the element is a fingerprint scanner.

17. A microelectronic element connected to the substrate of claim 1, wherein the element is an image sensor.

18. A microelectronic element connected to the substrate of claim 1, wherein the element is an RF package.

19. A microelectronic assembly, comprising:
   a substrate including:
   (a) a dielectric structure having first and second regions, said dielectric structure bearing contact elements in said first region and bearing unitary traces extending between said first and second regions, at least some of said traces being connected to at least some of the contact elements; and
   (b) a first dielectric encapsulant disposed on said structure in said first region, said first dielectric encapsulant being disposed so said contact elements are exposed at a surface of the first dielectric encapsulant in said first region; and at least one microelectronic device which terminals are selectively connected to said contact elements using a ball bonding technique or a wire bonding technique.

20. The assembly as claimed in claim 19 wherein said first dielectric encapsulant reinforces said structure in said first region so that said first region is more rigid than said second region.

21. The assembly as claimed in claim 19 wherein at least a portion of the first dielectric encapsulant forms a wall projecting from the structure and surrounding at least some of the at least one microelectronic device.

22. The assembly as claimed in claim 21 wherein the substrate in the first region further comprises an optical component affixed to the wall.

23. The assembly as claimed in claim 21 wherein the substrate further comprises a recess receiving the at least one microelectronic device.

* * * * *

UNITED STATES PATENT AND TRADEMARK OFFICE
CERTIFICATE OF CORRECTION

| | | |
|---|---|---|
| PATENT NO. | : 7,659,617 B2 | Page 1 of 1 |
| APPLICATION NO. | : 11/606771 | |
| DATED | : February 9, 2010 | |
| INVENTOR(S) | : Kang et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 429 days.

Signed and Sealed this

Thirtieth Day of November, 2010

David J. Kappos
*Director of the United States Patent and Trademark Office*